United States Patent [19]

Wilson

[11] Patent Number: 5,353,026
[45] Date of Patent: Oct. 4, 1994

[54] FIR FILTER WITH QUANTIZED COEFFICIENTS AND COEFFICIENT QUANTIZATION METHOD

[75] Inventor: James Wilson, Sharon, Mass.

[73] Assignee: Analog Devices, Inc., Norwood, Mass.

[21] Appl. No.: 990,717

[22] Filed: Dec. 15, 1992

[51] Int. Cl.$^5$ ............................................. H03M 3/02
[52] U.S. Cl. ................... 341/143; 364/724.16
[58] Field of Search ............ 341/143; 364/724.16, 364/745; 375/26

[56] References Cited

U.S. PATENT DOCUMENTS

| | | | |
|---|---|---|---|
| 5,153,846 | 10/1992 | Rao | 364/724.16 |
| 5,222,084 | 6/1993 | Takahashi | 370/32.1 |
| 5,243,552 | 9/1993 | Asakura | 364/757 |
| 5,245,561 | 9/1993 | Sugiyama | 364/724.19 |
| 5,257,056 | 10/1993 | Thompson et al. | 341/118 |

OTHER PUBLICATIONS

Fink et al., Ed, *Electronics Engineers' Handbook*, 3rd Ed. McGraw-Hill Book Co., 1989, pp. 8.78–8.80.
Candy et al., "Oversampling Methods for A/D and D/A Conversion", Oversampling Delta-Sigma Data Converters, Ed. by Candy et al., *IEEE Press*, 1992, pp. 1–25.
Hwang, "Computer Arithmetic–Principles, Architecture, and Design," John Wiley & Sons, 1979, pp. 149–155 and 213–238.

*Primary Examiner*—Marc S. Hoff
*Attorney, Agent, or Firm*—Koppel & Jacobs

[57] ABSTRACT

The n-bit coefficients of a FIR filter are encoded into m-bit digital words that represent selected bits of the original coefficients, where m is less than n, together with shift words that represent the order of the selected bits within the original n-bit coefficients. A software $\sigma$-$\Delta$ modulator is used to implement the encoding. The reduction in coefficient bits allows for a corresponding reduction in hardware multiplier capacity required to convolve the encoded coefficients with input data. The quantization error from the encoding is shaped to a higher frequency range that can later be filtered out. The coefficients are preferably encoded into a format that coincides with the data format employed by the multiplier, such as by using a Robertson's algorithm to encode to a modified Booth format.

38 Claims, 3 Drawing Sheets

FIR FILTER WITH QUANTIZED COEFFICIENTS AND COEFFICIENT QUANTIZATION METHOD

BACKGROUND OF THE INVENTION

1. Field of the Invention

This invention relates to finite impulse response (FIR) filters, and more particularly to FIR filters with quantized filter coefficients.

2. Description of the Related Art

FIR filters have come into use as digital filters whose performance typically equals or exceeds that available with passive RLC filters. They can be used in numerous digital environments, such as for removing images of the input signal to a digital-to-analog converter (DAC) that results from increasing the input sampling rate. Such filters are described in general in Fink et al., Ed., *Electronics Engineers' Handbook*, 3rd Ed. McGraw-Hill Book Co., 1989, pages 8.78–8.80.

Figure 1:
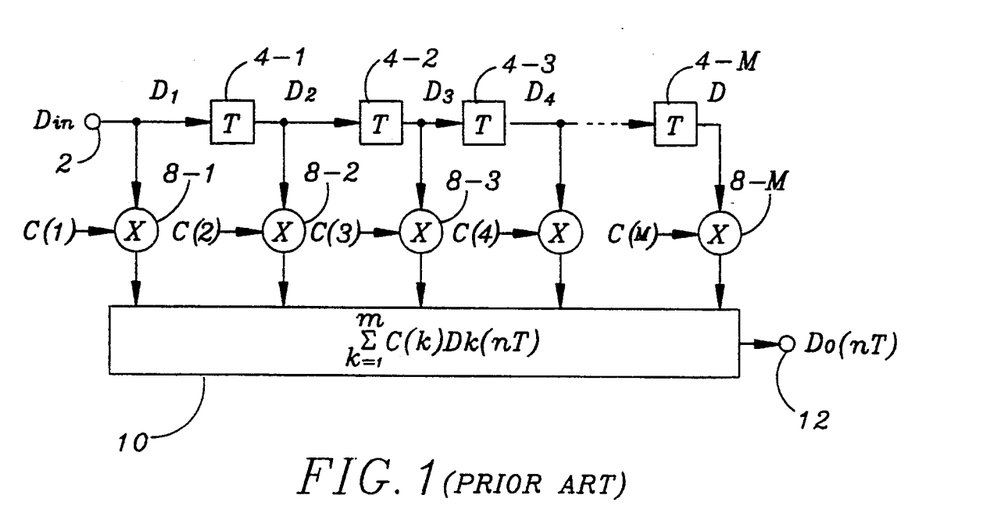
FIG. 1 is a block diagram of a conventional FIR filter, described above.

A block diagram of a typical FIR filter is given in FIG. 1. A digital input data signal Din, representing an analog signal sampled at a sample rate $f_s = 1/T$, is applied to an input terminal 2. The filter includes M delay stages 4-1, 4-2, 4-3 . . . 4-M, each of which delays the associated sample by the period T. At the initial data node D1 and at the data nodes D2, D3 . . . Dm following each delay stage, the input signal is multiplied by a respective weighting coefficient C(k) in respective multipliers 8-1, 8-2, 8-3 . . . 8-M. The products are summed together in a summer 10 to provide the filter output in discrete time at an output terminal 12. The output Do(nT) at a time nT is given by the expression $$\sum_{k=1}^{M} C(k)D_k(nT);$$

this represents the linear convolution of the coefficients C(k) with the input signal. Where c(k) is the sequence of coefficients which defines the filter's impulse response, which is determined as the inverse Fourier transform of the desired filter response in the frequency domain, Do(nT) is the desired filter output in discrete time.

One significant drawback of the FIR filter described above is that, when the input data and filter coefficients have high resolutions with significant numbers of bits, a large amount of hardware circuitry is required to perform the D×C convolution. A synchronous filter could be substituted for the FIR filter to reduce the hardware requirements, since synchronous filters use fewer coefficients. However, the attenuation characteristics of a synchronous filter are not as good as those of a FIR filter, and residual portions of the signal at undesired frequencies may propagate through the filter.

SUMMARY OF THE INVENTION

The present invention seeks to provide an improved FIR filter system in which the bit requirements of the filter coefficients are significantly reduced, thus allowing for a significant reduction in the hardware multiplier capacity, and a method of encoding the filter coefficients to this end. When used in a DAC, it also seeks to remove errors that may be generated in the encoding process.

To reduce the size of the filter coefficients, conventional n-bit coefficients are processed by a software sigma-delta ($\sigma$-$\Delta$) modulator into lower order m-bit quantized words plus shift words, where m is less than n. The m-bit words represent selected bits of the original n-bit coefficients, while the shift words represent the order of the selected bits within the original n-bit coefficients. To perform the data-coefficient convolution, the shift words are first applied to corresponding data inputs, followed by multiplying the shifted inputs by the m-bit coefficients.

In one embodiment, the most significant of the selected bits from the original n-bit coefficient is an active bit, the selected bits are sequentially ordered within the original coefficient, and the shift word represents the location of the bit sequence within the original filter coefficient. With this approach the shift word value is a count of the number of inactive bits that precede the most significant active bit. In another embodiment a series of active bit groups are generated to represent the original coefficient, and shift words represent the number of intervening inactive bits between successive groups.

The encoding of the original n-bit coefficient into the lower order m-bit coefficient, plus shift word, produces a quantizing error that is fed back to the next coefficient in the software $\sigma$-$\Delta$ modulator. This error term is predominately at high frequency because of the closed loop nature of the modulator. It is shaped by a Z-plane transformation, and is later filtered out by a conventional analog filter employed in a DAC. The quantization error can either be shaped by an open-ended high pass frequency function or, if frequency spectrum folding occurs, by a pass band frequency function.

Further efficiencies are achieved by encoding the original coefficients into a format that coincides with the format used by the filter's hardware multipliers. Where the multipliers use a modified Booth format, the encoding routine preferably employs a form of Robertson's algorithm to distribute three active coefficient bits among six output places.

These and other features and advantages of the invention will be apparent to those skilled in the art, taken together with the accompanying drawings.

DETAILED DESCRIPTION OF THE INVENTION

Figure 2:
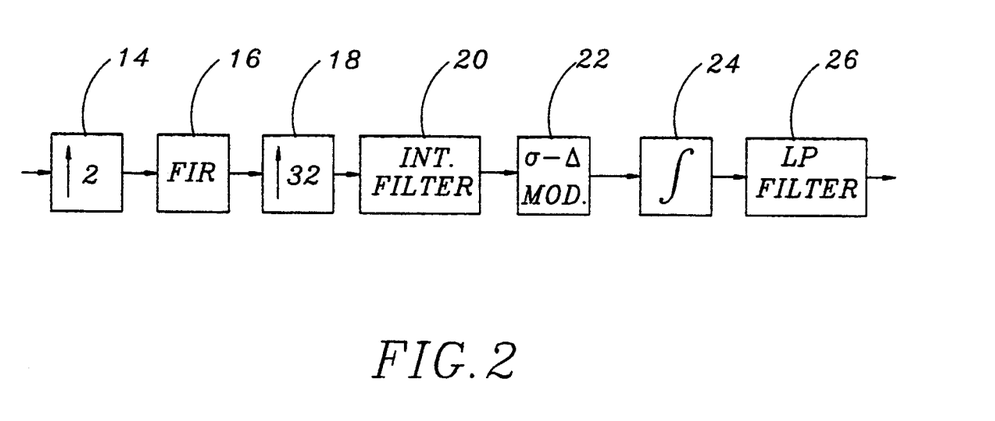
FIG. 2 is a block diagram of a DAC to which the invention is applicable.

A block diagram of a DAC to which the present invention is applicable is given in FIG. 2. Input digital data within a given frequency range, say 48 KHz, is processed through an ×2 up-sampler 14, which increases the signal's sample rate by a factor of 2 through the insertion of a zero between success sample data points. This process creates images of the original signal, which are eliminated in a conventional FIR filter 16. The signal's sampling rate is again increased in a ×32 up-sampler 18, which inserts additional zeros between sample data points. At the output of up-sampler 18 the original 48 KHz signal will have a frequency range of about 3 MHz and a given digital resolution, say 20 bits.

Numerous images of the signal are produced by the up-sampler 18, and these images are removed by an interpolation FIR filter 20. This filter stores a set of filter coefficients that are convolved with the input signal in a hardware multiplier. The filter coefficients will also typically be on the order of 15-20 bits, requiring extensive hardware to perform the convolution with the 20-bit input data. As described below, the invention provides a way to modify the filter coefficients so that much less hardware multiplier and ROM capacity is required, and yet does not significantly degrade the accuracy of the system.

The signal (say 20 bits) at the output of the interpolation FIR filter 20 is converted to a single digit format that indicates the direction of changes in the sample values by a conventional $\sigma$-$\Delta$ modulator 22. $\sigma$-$\Delta$ modulators are well known and are described, for example, in Candy et al., "Oversampling Methods for A/D and D/A Conversion", *Oversampling Delta-Sigma Data Converters*, ed. by Candy et al., IEEE Press, 1992, pages 1-25.

The train of positive and negative pulses that are produced by the modulator 22 are integrated by an integrator circuit 24, thereby converting the signal to an analog format. The integrated signal is then processed through an analog low pass filter 26, which removes signal frequencies above the desired output analog range.

To substantially reduce the multiplier hardware required in the interpolation filter 20, the normal filter coefficients are encoded by operating upon them with a software $\sigma$-$\Delta$ modulator routine. Unlike a conventional $\sigma$-$\Delta$ modulator, however, in which the input is converted into, a train of positive or negative pulses in a fixed binary order, the software $\sigma$-$\Delta$ modulator used by the invention encodes the input signal into a floating binary order, together with a shift function, that requires much less multiplier hardware to convolve with the input data, and yet has a much smaller quantization error than the conventional $\sigma$-$\Delta$ modulator. The latter feature is important in later filtering out the error term from the filter output, as described below.

Figure 3:
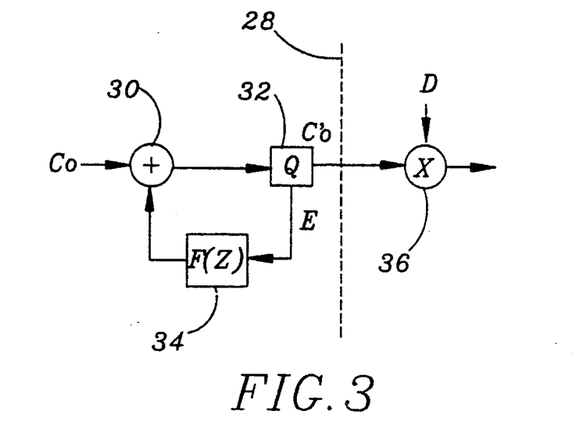
FIG. 3 is a flow diagram of a software $\sigma$-$\Delta$ modulator routine used to encode the FIR filter coefficients, with its output applied to a hardware multiplier.

A block diagram of the new FIR filter is given in FIG 3, with the software coefficient encoding portion indicated to the left of dashed line 28, and the hardware multiplier section to the right. The software routine operates upon each of the conventional FIR filter coefficients to place them in the desired encoded format. With the conventional signed binary format used for the filter coefficients prior to encoding, the most significant bit of the coefficient is assigned a negative value, with all of the less significant bits being positive.

The conventional standard FIR coefficient, designated $C_o$, is applied to a summing junction 30 in the software. The output from the summing junction is directed to a quantizer 32 which produces an encoded filter coefficient $C_o'$, and a quantization error term E. The error E is processed by a Z-plane transformation routine 34 that shapes it into a desired higher frequency range, and is then fed back for summing with the next input coefficient $C_o$ in the summing junction 30. The encoded coefficient $C_o'$ is applied to the filter's hardware multiplier circuit 36, where it is convolved along with the other encoded filter coefficients with the input data signal D. An output is provided from the multiplier that represents the input data filtered in accordance with the FIR filter characteristics.

Figure 4:
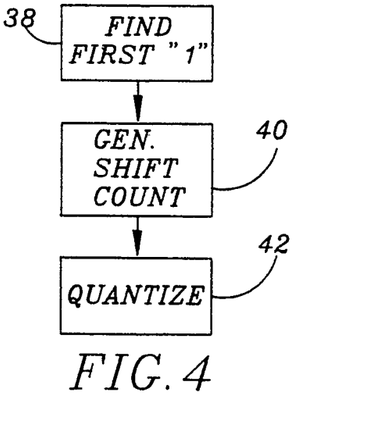
FIG. 4 is a flow diagram of one quantization routine that can be used in the software $\sigma$-$\Delta$ modulator.

FIG. 4 illustrates a preferred quantization routine for the $\sigma$-$\Delta$ modulations software; the routine can be used to reduce an input n-bit filter coefficient to a lower order m-bit coefficient suitable for convolving with the filter's data input. The approach taken is to reduce the numerical value of the input n-bit coefficient down to m bits, and to allow the m bits to float with respect to the fullscale input to minimize the quantization error at each step. If the input to the quantizer is close to full scale, the m bits automatically scale towards the most significant bits, whereas if the input coefficient is very small the m bits will automatically scale towards the least significant input bits. The overall effect is to produce encoded filter coefficients that have very few "1s" in them, and thus can be implemented physically with a reduced hardware set.

The quantization routine first scans over the input coefficient $C_o$ to locate the most significant active bit, or "1", in block 38. Based upon the location of the first active bit, a shift count is generated which represents the number of inactive or "0" bits that precede (have a more significant order than) the first "1" in block 40. Finally, selected bits from $C_o$ that begin with the first "1" are quantized in block 42 into an m-bit format.

The encoding scheme employed in the software $\sigma$-$\Delta$ modulator preferably produces encoded coefficients $C_o'$ in a format that coincides with the format used by area efficient hardware multipliers in the filter. Current multipliers commonly employ the well known modified Booth format, in which three conventional binary bits are represented by a recoded value that can be $-2$, $-1$, 0, $+1$ or $+2$. Specifically, the modified Booth format represents the bits 100 as $-2$, the bits 101 and 110 as $-1$, the bits 000 and 111 as 0, the bits 001 and 010 as $+1$, and the bits 011 as $+2$.

When the modified Booth format is used by the multipliers, the quantizer 32 employs a standard Robertson's algorithm to quantize the input bits that begin with the first "1" into a compatible format. For example, Robertson's algorithm can be used to encode the input coefficient into a desired number (such as 3) of bit pairs, in which only one bit of each pair can be active. Since the multiplier's hardware requirements vary with the number of active bits, in effect the encoded coefficient is equivalent to a 3-bit word. As such it requires a much smaller multiplier capacity than the original n-bit coefficient, which is typically on the order of 15-20 bits or more. Each pair of bits in the encoded format is stored in 3 bits of read only memory (ROM), with the first ROM bit corresponding to the sign of the encoded pair, and the other two bits to its bit value. The ROM requirements are also significantly reduced with the invention.

Figure 5:
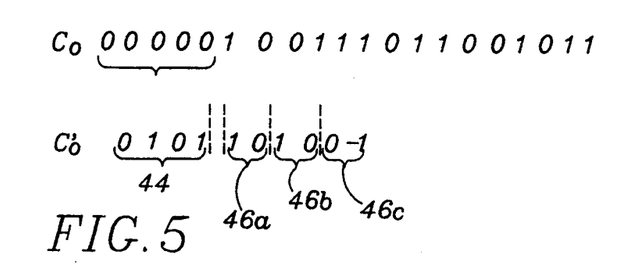
FIG. 5 is a diagram illustrating the encoding of a 20-bit input coefficient with the quantization routine of FIG. 4.

An example of how the software routine of FIG. 4 encodes a 20-bit input coefficient Co into an altered format with a much lower multiplier requirement is provided in FIG. 5. The input coefficient Co is illustrated as beginning with five "0's", followed by an active "1" bit and then a sequence of "1's" and "0's". A shift value is first generated which gives a count of the number of "0" bits preceding the most significant "1" bit. This shift value 44 is shown occupying four bits, and giving a binary count of five "0's". Of course, a shift count that is limited to four binary bits cannot give a shift value greater than 15. If the first "1" is preceded by more than 15 "0's", however, it would be at a location with a significance so low that it could be left in the quantization error without harm. Allocating five bits to the shift value would have the potential for a higher shift count, but would normally not be necessary.

The quantized coefficient that results from the application of Robertson's algorithm to the portion of the input coefficient Co beginning with the first "1" is indicated by bit pairs 46a, 46b and 46c. The illustrated bit pattern has a cumulative value of 39, representing the sum of "+1" in the "32" and "8" columns and "−1" in the "1" column. This is the quantized value of the Co bits beginning with the first "1". A quantization error exists between the 6-bit Robertson's formatted coefficient word and the 15-bit simple binary formatted word that begins with the first Co "1"; this difference is the error term E that is shaped at a higher frequency and fed back for summation with the next input coefficient Co as described in connection with FIG. 3.

In performing the convolution of the encoded coefficients with the input data, the shift values are first applied to the input data before it proceeds into the multiplier. Binary place shifters are very easy to implement in hardware, and require much less area than multipliers. Thus, the large multiplier that would otherwise have been required for the 20-bit Co FIR coefficient is replaced by a much smaller multiplier for the three active bits in the encoded coefficient, plus a small shifter.

Figure 6:
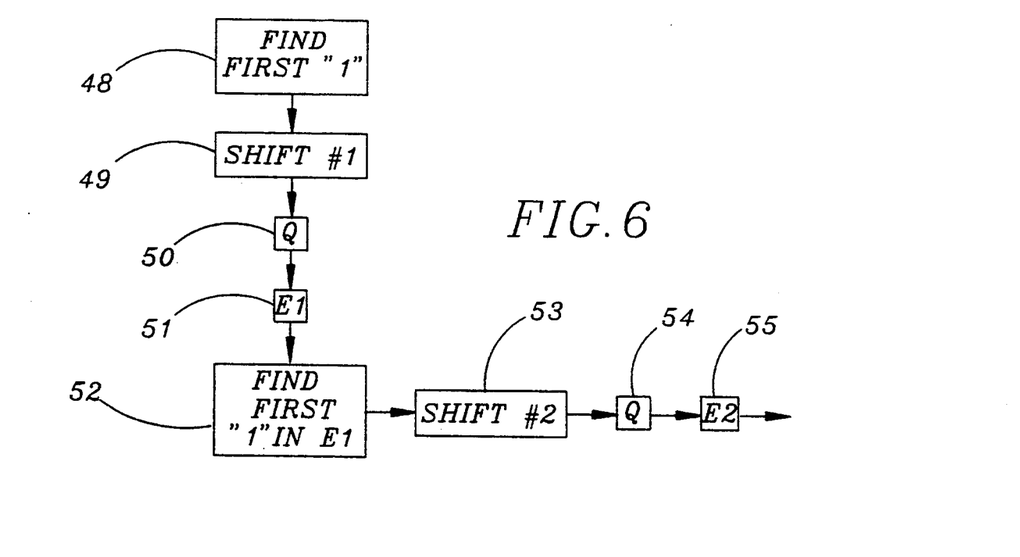
FIG. 6 is a flow diagram illustrating another encoding routine that can be performed by the software $\sigma$-$\Delta$ modulator.

As described thus far, sequentially ordered bits of the original Co n-bit coefficient are encoded into a lower order m-bit word, plus a shift value that represents the location of the selected bit sequence within the n-bit word. The invention also includes other encoding formats for reducing larger n-bit input coefficients to smaller m-bit words plus shift values. FIG. 6 illustrates an example of a different encoding technique that is compatible with bit serial architectures. In this routine, the most significant (first) "1" bit in the input coefficient is first located (block 48), and its position noted. A shift count (block 49) is generated to mark the number of "0s" preceding the first "1". The coefficient is then quantized using Robertson's algorithm (block 50) to produce a bit pair that has the possible values ±2, ±1 or 0 at this bit order. This quantized value is subtracted from the initial coefficient to produce an error E1 (block 51). The leading "1" in the error E1 is now located (block 52) to produce a second shift count (block 53), and is again quantized using Robertson's algorithm to produce the next bit pair (block 54). The bit pair at this particular order is then subtracted from the first error E1 to produce a second error E2 (block 55), and the process repeats until the remaining error drops below a predetermined level.

Figure 7:
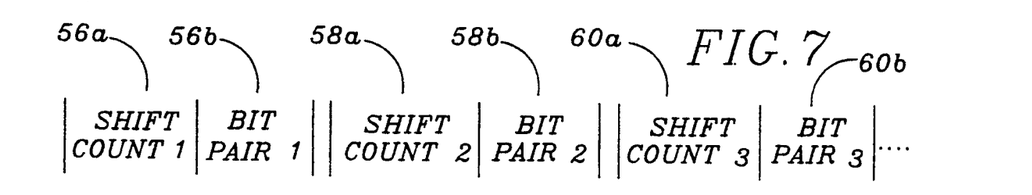
FIG. 7 is a diagram illustrating the encoding achieved with the routine of FIG. 6.

The encoded coefficient that results from the encoding routine of FIG. 6 is illustrated in FIG. 7. It consists of a shift count 56a and bit pair 56b that represent the position and quantized value of the word that begins with the first "1" in the original coefficient; a shift count 58a and bit pair 58b that represent the position (relative to the first shift count 56a) and quantized value of the first error term E1; a shift count 60a and bit pair 60b that represent the position (relative to the second shift count 58a) and quantized value of the second error term E2; etc. This is a modified Booth format that is compatible with the hardware multiplier.

Figure 8:
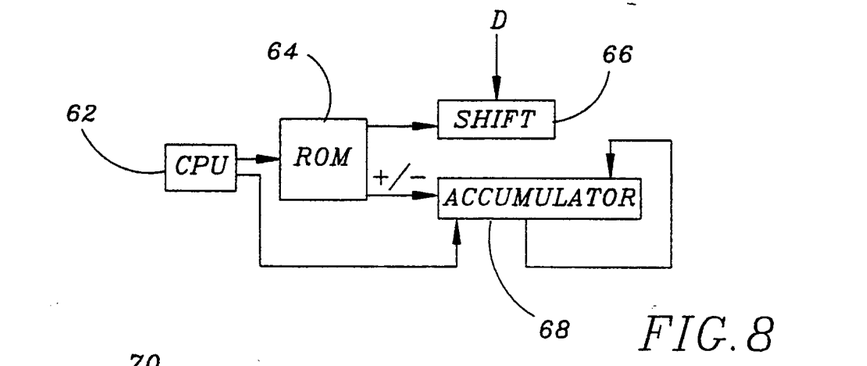
FIG. 8 is a block diagram illustrating the mechanism used to store the encoded coefficients and to call them up for convolution with input data.

FIG. 8 illustrates how the encoded coefficients are used in the FIR filter convolution. The encoded coefficients are generated from the conventional filter coefficients through a software program that is executed on a conventional computer 62 (separate from the resident computer on the DAC chip that runs the DAC functions), and are stored in a ROM 64 on the DAC chip. Input data samples D are directed into a hardware binary place shifter 66, to which the shift value portion of the encoded coefficient is applied from ROM 64. This causes the binary order of the input data sample to shift down by the number of initial coefficient "0's" represented by the stored shift count. The shifted data sample is then forwarded to an accumulator 68, which receives the encoded m-bit coefficient word from the ROM and operates under computer control to perform the data-coefficient convolution through a multiplication cycle.

One of the important aspects of the invention involves the manner in which the quantization error term E is handled. The presence of this term in the output from the FIR filter will produce an error in the ultimate analog signal generated from the DAC shown in FIG. 2, unless it is removed. The removal is accomplished by shaping the error term to a frequency regime that is not transmitted by the low pass filter 26. While the filtering of $\sigma$-$\Delta$ modulator errors in this fashion is not new per se, with conventional $\sigma$-$\Delta$ modulators the error term is so large that it is difficult to completely shape its full energy into a sufficiently high frequency range to be completely filtered. This is because the output of a conventional $\sigma$-$\Delta$ modulator has a fixed binary order. With the floating encoding format used for the software $\sigma$-$\Delta$ FIR coefficient modulator of the present invention, however, the ability to shift the bit order of the encoded coefficient significantly reduces the quantization error.

Figure 9:
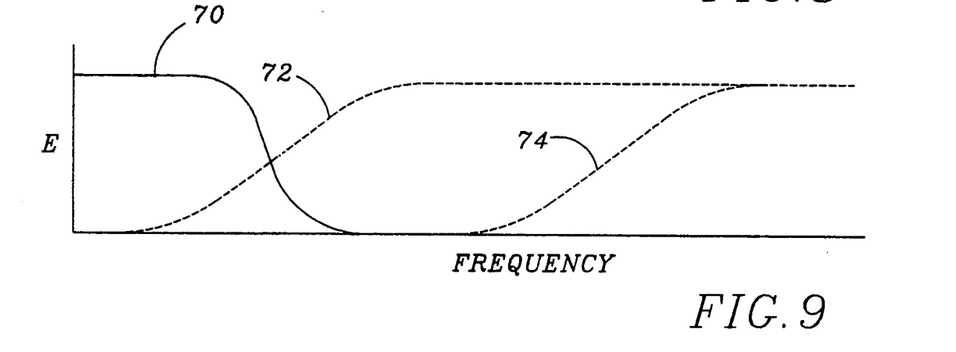
FIG. 9 is a graph comparing the frequency shaping of the error term in the software $\sigma$-$\Delta$ modulator with the pass band of a downstream filter employed in the DAC of FIG. 2, and also with the error shaping achieved by a conventional $\sigma$-$\Delta$ modulator.

An illustration of the improvement in error frequency shaping provided by the invention is given in FIG. 9. The frequency response of the low pass filter 26 is shown by solid line 70; an example of a nominal upper cutoff frequency for the filter would be 200 KHz. With a conventional $\sigma$-$\Delta$ modulator, the amount of frequency shaping possible for the quantization error signal is limited by the ability of the upper frequency ranges to carry the high energy error signal. Accordingly, the error signal's shaped frequency range (illustrated by dashed error frequency curve 72), may overlap the filter's pass band. With the present invention, however, the size of the quantization error is greatly reduced. This allows the error term to be shaded to a higher frequency range, illustrated by dashed line 74, well above the pass band of filter 26.

Figure 10:
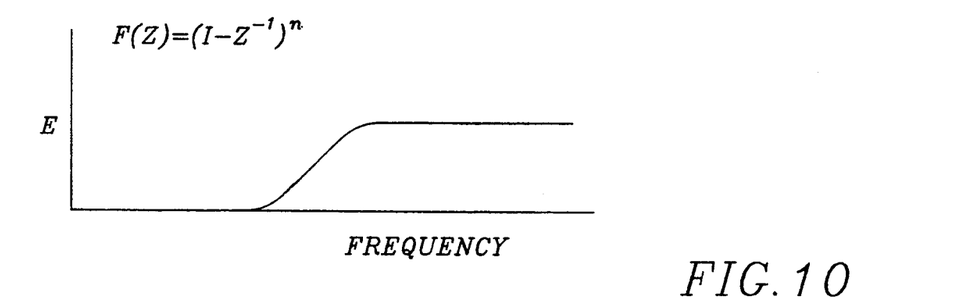
FIGS. 10 and 11 are graphs of frequency shapings that can be designed respectively for an open-ended high frequency pass range, and for a limited high frequency pass band.

The nature of the error term's frequency shaping is determined by the Z-transformation function 34 shown in FIG. 3. In general, the error will be pushed to higher frequencies as the order of the transformation increases. The greater the number of bits used for the encoded FIR filter coefficients, the greater can be the transformation order and the resulting frequency shaping that can be sustained. However, there are stability limits to how high an order can be used for the transformation, and also limits on the ability of the downstream circuitry to handle the high frequency energy. To produce a frequency shaping to an open-ended high frequency pass band, illustrated in FIG. 10, the Z transformation function has the form $$F(Z) = (1-Z^{-1})^n,$$

where n is the order of the transformation. With a 20-bit starting filter coefficient Co and an encoded coefficient Co' with a 4-bit shift word and a 6-bit (3 active bits) coefficient word, a fifth order Z-transformation is currently preferred.

Figure 11:
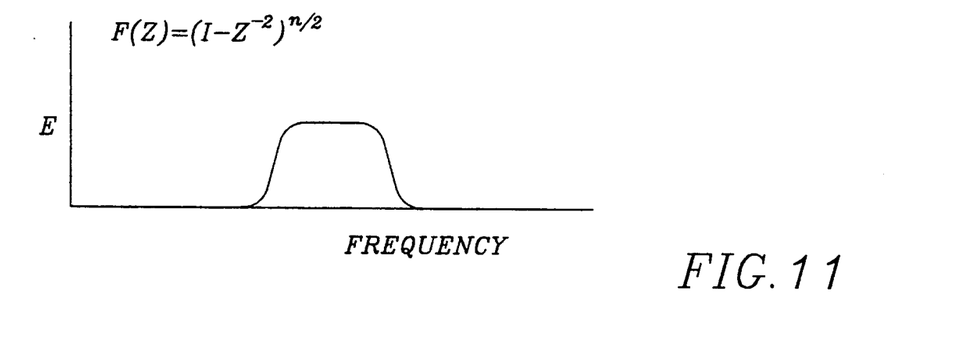

In some circumstances, shaping the quantization error to an open-ended high frequency range may be undesirable. This can occur when switching between different communication channels with different sampling rates, which alter the filter's frequency spectrum. If the sample rate is cut in half, for example, the frequency spectrum will fold over itself. This can cause the error signal that has been shaped to an open-ended high pass level to fold down to lower frequencies within the pass band of the low pass filter 26, or even to DC. Such an undesirable result can be avoided by shaping the error term to a limited high frequency pass band that does not extend into the low pass filter range when folded over itself. This type of pass band is illustrated in FIG. 11. It is implemented with a Z-transformation of the form:

$$F(Z) = (1-Z^{-2})^{n/2}.$$

With this characteristic, a tenth order band pass filter, for example, will have five zeros at DC and another five zeros at $f_s/2$, where $f_s$ is the sampling frequency.

The invention thus allows a FIR filter to be implemented with a much smaller hardware multiplier capacity than previously, and also provides for effectively removing the error term that is generated in the process. As an example of its software implementation, a C program listing is provided in Appendix 1 that takes a relatively simple modulator and modifies the quantizer structure to implement the floating modified Booth format. The program (nbitquant5.c) provides a prompt for the total number of $\pm 1$'s to be used in the encoded m-bit coefficient word, followed by a shift word. It uses a fifth order Z-transformation with all the zeros at DC. The program requires a DP floating point input in binary format in which the largest coefficient is scaled to 0.5, and returns results in a DP floating point binary format. The input file name for the program is insig.dat, and the output file name is outsig.dat. While the program is running it also prints the recoded bits to the screen.

While particular embodiments of the invention have been shown and described, numerous variations and alternate embodiments will occur to those skilled in the art. Accordingly, it is intended that the invention be limited only in terms of the appended claims.

APPENDIX 1

```
nbitquant5.c define FOREVER 1 define Npol 4 include <stdio.h> include <math.h>

FILE        *insig;

FILE        *outsig;

double      nstor4, quant, MAX, MAX1, zer;

double      A0, A1, A2, A3, B0, B1, B2, B3, R0, R1,
            scale_fact, mean_sqrerr, fin_scl,
            best_err;

double      nstorz1, nstorz2, nstorz3, nstorz4,
            nstorz5;

int         i, j, k, l, m, nbits, errstrt, errstop;

main()

{
```

```c
double            input_dat;
char              input_str[1024];
printf("ENTER THE NUMBER OF BITS FOR QUANTIZATION:");
scanf("%d",&nbits);
printf("ENTER THE SCALE FACTOR FOR INPUT COEFF'S:");
scanf("%lf",&scale_fact);
printf("ENTER THE POINT AT WHICH TO START ACCUMULATING
   ERRORS:");
scanf("%d",&errstrt);
printf("ENTER THE POINT AT WHICH TO STOP ACCUMULATING
   ERRORS:");
scanf("%d",&errstrt);
best_err = 1.0;

if (!(insig = fopen("insig.dat", "rb")))

{
    printf("\n error: can't open file %s",
        "insig.dat");
    exit(1);
}
if (!(outsig = fopen("outsig.dat", "wb")))
{
    printf("\n error: can't open file %s",
        "outsig.dat");
    exit(1);
}
quant = 1.0;
nstor4 = 0;
nstorz1 = 0;
nstorz2 = 0;
nstorz3 = 0;
nstorz4 = 0;
nstorz5 = 0;
MAX = 1.0;
MAX1 = 1.0;
zer = 1;
i=0;
j=0;
```

```
k=0;
m=0;
mean_sqrerr=0;

do {
    if ((!fread(&input_dat, sizeof(double), 1,
        insig)) || (m >=errstop))
    {
        if (mean_sqrerr < best_err)
            {
            printf("\nMEAN SQUARE ERROR = %1.12f\n",
                mean_sqrerr);
            printf("SCALE FACTOR = %1.12f\n",scale_
                fact);
            best_err = mean_sqrerr;
            }
        rewind(insig);
        printf("\+");
        exit(0);
    }
    else
    {
        input_dat = input_dat*scale_fact;
        k = 0;
        l = 0;
        m = m+1;
        quant = 0;
        nstor4    =   input_dat+5*nstorz1-
        10*nstorz2+10*nstorz3-5*nstor4+nstorz5;
        if ((m >=errstrt) && (m <=errstop))
            {
        printf("\nMAGNITUDE OF QUANTIZER =
            %1.12f",nstor4);
        printf("\n");
    }
    for (j=0;j<=20;j = j + 2)
    }
        if ((nstor4 >=(.375/((double)(1<<j))))
```

```
                && (k < nbits))
                {
                quant = quant + (1.0/((double)
                    (1<<(j+1))));
                nstor4 = nstor4 - (1.0/((double)
                    (1<<(j+1))));
                k = k + 1;
                l = l + 2;
                if ((m >=errstrt) && (m <=errstop))
             {
                    printf("+0 ");
             }
            }
        else if ((nstor4 >= (.125/((double)
            (1<<j)))) && (k < nbits))
            {
            quant = quant + (1.0/(double)
                (1<<(j+2))));
            nstor4 = nstor4 - (1.0/((double)
                (1<<(j+2))));
            k = k + 1;
            l = l + 2;
            if ((m >= errstrt) && (m <= errstop))
                {
                    printf("0+ ");
                }
            }
        else if ((nstor4 <= (-.375/((double)
            (1<<j)))) && (k < nbits))
            }
                quant = quant - (1.0/((double)
                    (1<<(j+1))));
                nstor4 = nstor4 + (1.0/((double)
                    (1<<(j+1))));
                k = k + 1;
                l = l + 2;
                if ((m >=errstrt) && (m <=errstop))
                    {
```

```
                printf("-0 ");
            }
        }
    else if ((nstor4 <= (-.125/(double)
       (1<<j)))) && (k < nbits))
        }
            quant = quant - (1.0/((double)
                (1<<(j+2))));
            nstor4 = nstor4 + (1.0/((double)
                (1<<(j+2))));
            k = k + 1;
            l = l + 2;
            if ((m >=errstrt) && (m <=errstop))
                {
                    printf("0- ");
                }
        }
    else if (k < nbits)
      {
        if ((m >=errstrt) && (m <= errstop))
            {
                printf("00 ");
            if ((k == 0) && (l ==14)) || (k > 0))
                {
                    k = k + 1;
                    l = l + 2;
                }
            if (k == nbits)
                {
                    k = k + 1;
                }
            }
      }
    else
      {
        if (k == nbits)
            {
                k = k + 1;
            }
```

```
            if ((m >= errstrt) && (m <=errstop))
            {
                    printf("00 ");

}
          }
       }
       if ((m >=errstrt) && (m<= errstop))
       {
            mean_sqrerr = mean_sqrerr + (nstor4*
               nstor4);
            fwrite(&quant, sizeof(double), 1, outsig);
            nstorz5 - nstorz4;
            nstorz4 = nstroz3;
            nstorz3 = nstorz2;
            nstorz2 = nstorz1;
            nstorz1 = nstor4;
       }
    }
 } while (FOREVER);
}
```

I claim:

1. A method of encoding an n-bit digital word, comprising:
   selecting at least one bit within said n-bit word,
   generating an m-bit digital word that represents said selected bits, where m is less than n, and
   generating a shift word that represents the order of said selected bits within said n-bit word.

2. The method of claim 1, wherein the most significant of said selected bits is an active bit.

3. The method of claim 2, wherein said selected bits are sequentially ordered within said n-bit word, and said shift word represents the location of said bit sequence within said n-bit word.

4. The method of claim 3, wherein said shift word represents the number of inactive bits in said n-bit word that have a more significant order than the most significant of said selected bits.

5. The method of claim 2, wherein said m-bit digital word represents a quantized value of the portion of the n-bit word which begins at the most significant active bit in said n-bit word, and said shift word represents the location of said most significant active bit within said n-bit word.

6. The method of claim 5, said quantized value having an associated error term, wherein said m-bit digital word further represents a quantized value of the portion of the error term which begins at the most significant active bit in said error term, and said shift word further represents the location of said most significant active error term bit within said error term.

7. A method of encoding a series of n-bit digital words, comprising:
   selecting a plurality of bits within each n-bit word, at least one of said selected bits being an active bit if the n-bit word includes at least some active bits,
   generating an m-bit digital word that represents said selected bits, where m is less than n,
   generating a shift word that represents the order of said selected bits within said n-bit word, said m-bit word when shifted by the value of said shift word to the scale of said n-bit word differing from said n-bit word by a quantization error, and
   feeding back said quantization error and combining it with the next n-bit word.

8. The method of claim 7, further comprising the step of shaping the frequency of said quantization error before feeding it back to the next n-bit word.

9. The method of claim 8, further comprising the step of filtering out said frequency shaped quantization errors from said m-bit digital words.

10. The method of claim 9, wherein the frequency of said quantization error is shaped to a high pass frequency range.

11. The method of claim 9, wherein the frequency of said quantization error is shaped to a predetermined high frequency pass band.

12. The method of claim 7, wherein said selected bits are sequentially arranged within said n-bit word, and said shift word represents the location of said bit sequence within said n-bit word.

13. The method of claim 12, wherein said shift word represents the number of inactive bits in said n-bit word that have a more significant order than the most significant of said selected bits.

14. The method of claim 7, wherein said m-bit digital word represents a quantized value of the portion of the n-bit word which begins at the most significant active bit in said n-bit word, and said shift work represents the location of said most significant active bit within said n-bit word.

15. The method of claim 14, said quantized value having an associated error term, wherein said m-bit digital word further represents a quantized value of the portion of the error term which begins at the most significant active bit in said error terms, and said shift word further represents the location of said most significant active error term bit within said error term.

16. A finite impulse response (FIR) filter system, comprising:
 means for providing n-bit FIR filter coefficients,
 means for operating upon said n-bit coefficients to reduce them to lower order coefficients comprising combinations of respective m-bit quantized words and shift words, wherein m is less than n and said shift words relate said m-bit words to a binary order within their respective n-bit coefficients,
 means for receiving input data words, and
 multiplier means connected to convolve said data words with said lower order coefficients to yield a filtered output.

17. The FIR filter system of claim 16, wherein said means for operating upon said n-bit coefficients comprises means for:
 a) selecting a plurality of bits within each of said n-bit coefficients, at least one of the selected bits for each n-bit coefficient being an active bit if the coefficient has at least some active bits,
 b) generating said m-bit quantized words to represent said selected bits,
 c) generating said shift words to represent the order of said selected bits within their respective n-bit coefficients, with said m-bit words when shifted by the values of their respective shift words to the scale of their respective n-bit coefficients differing from said coefficients by respective quantization errors, and
 d) feeding back said quantization errors and combining them with the next n-bit coefficients.

18. The FIR filter system of claim 17, wherein said operating means comprises a computer that is programmed to perform said operation in software.

19. The FIR filter system of claim 16, said multiplier comprising a hardware multiplier.

20. The FIR filter system of claim 16, wherein said operating means generates said m-bit quantized words using Robertson's algorithm, and said multiplier means operates upon inputs in a modified Booth format.

21. The FIR filter system of claim 16, said operating means further comprising means for shaping the frequency of said quantization errors before feeding them back to the next n-bit coefficients.

22. The FIR filter system of claim 16, wherein said selected bits are sequentially arranged within said n-bit word, and said shift word represents the location of said bit sequence within said n-bit word.

23. The FIR filter system of claim 22, wherein said shift word represents the number of inactive bits in said n-bit word that have a more significant order than the most significant of said selected bits.

24. The FIR filter system of claim 16, wherein said m-bit digital word represents a quantized value of the portion of the n-bit word which begins at the most significant active bit in said n-bit word, and said shift word represents the location of said most significant active bit within said n-bit word.

25. The FIR filter system of claim 25, said quantized value having an associated error term, wherein said m-bit digital word further represents a quantized value of the portion of the error term which begins at the most significant active bit in said error term, and said shift word further represents the location of said most significant active error term bit within said error term.

26. The FIR filter system of claim 16, said multiplier including means for shifting said input data words by the shift values of said shift words prior to convolving said data words with the corresponding lower order coefficients.

27. A finite impulse response (FIR) filter system, comprising:
 means for providing n-bit FIR filter coefficients,
 a sigma-delta modulator for quantizing said n-bit filter coefficients to respective m-bit quantized coefficients, where m is less than n but greater than one, plus respective quantization error terms, and
 multiplier means connected to convolve input data words with said quantized coefficients to produce a filtered output.

28. The FIR filter system of claim 27, wherein said sigma-delta modulator quantizes selected bits of said n-bit filter coefficients into said m-bit quantized coefficients together with shift words that represent the order of said selected bits within said n-bit coefficient.

29. The FIR filter system of claim 28, said multiplier means including means for shifting the binary order of said input data words by the value of said shift words prior to convolving the input data words with said quantized coefficients.

30. The FIR filter system of claim 27, wherein said sigma-delta modulator shapes said quantization error terms to a higher frequency range.

31. The FIR filter system of claim 27, said sigma-delta modulator comprising a computer programmed to perform said sigma-delta modulation upon said n-bit FIR filter coefficients.

32. A digital-to-analog converter (DAC), comprising:
 means for increasing the sample rate of an input digital data signal,
 an interpolation finite impulse response (FIR) filter system connected to filter out images of the data signal produced by said sample rate increasing means,
 a hardware sigma-delta modulator connected to quantize the output of said FIR filter system to a series of + and − pulses,
 an integrator for integrating the output of said hardware sigma-delta modulator into an analog signal, and
 a low pass analog filter connected to filter the output of said integrator,
 wherein said FIR filter system comprises:
  means for providing n-bit FIR filter coefficients,
  a software sigma-delta modulator programmed to quantize said n-bit filter coefficients to respective m-bit quantized coefficients, where m is less than n, plus respective quantization error terms, and to shape said quantization error terms to a higher frequency range that is substantially outside the pass band of said low pass filter, and hardware multiplier means connected to convolve said input data signal with said quantized coefficients to produce a filtered output.

33. The DAC of claim 32, wherein said software sigma-delta modulator quantizes selected bits of said n-bit filter coefficients into said m-bit quantized coefficients together with shift words that represent the order of said selected bits within said n-bit coefficients.

34. The DAC of claim 33, said multiplier means including means for shifting the binary order of said input data words by the value of said shift words prior to convolving the input data words with said quantized coefficients 35. The DAC of claim 32, wherein said software sigma-delta modulator combines said transformed error terms with their respective n-bit filter coefficients being quantized.

36. A method of quantizing a series of multi-bit digital words, comprising:
providing a quantization function,
sensing a characteristic of said multi-bit words,
dynamically adjusting the quantization range of said quantization function for said words in accordance with their sensed characteristics, and
operating upon said words with their respective adjusted quantization functions.

37. The method of claim 36, wherein the sensed characteristic of said words is the order of their first active bit, and the quantization range of said quantization function is adjusted for each of said words to the order of the first active bit in said words.

38. The method of claim 37, wherein said quantization function operates upon said multi-bit words to generate quantized words having fewer bits than their respective multi-bit words, plus shift values which represent the quantization range for each of said quantized words.

* * * * *